United States Patent [19]

Sakamoto

[11] Patent Number: 5,353,254
[45] Date of Patent: Oct. 4, 1994

[54] SEMICONDUCTOR MEMORY DEVICE HAVING BURN-IN TEST CIRCUIT

[75] Inventor: Harumi Sakamoto, Ibaraki, Japan

[73] Assignee: Texas Instruments Incorporated, Dallas, Tex.

[21] Appl. No.: 887,442

[22] Filed: May 21, 1992

[51] Int. Cl.$^5$ .............................................. G11C 29/00
[52] U.S. Cl. .................................. 365/201; 324/765; 371/15.1; 439/54
[58] Field of Search ................... 324/158 R; 371/15.1, 371/21.1, 25.1; 439/68, 70, 43, 46, 49, 54; 365/201

[56] References Cited

U.S. PATENT DOCUMENTS

| | | | |
|---|---|---|---|
| 4,777,434 | 10/1988 | Miller et al. | 219/209 |
| 4,841,233 | 6/1989 | Yoshida | 324/158 R |
| 4,855,672 | 8/1989 | Shreeve | 324/158 R |
| 4,871,963 | 10/1989 | Cozzi | 324/158 R |
| 5,119,337 | 6/1992 | Shimizu et al. | 365/189.09 |
| 5,130,645 | 7/1992 | Levy | 371/22.1 |
| 5,173,906 | 12/1992 | Dreibelbis et al. | 371/22.5 |

OTHER PUBLICATIONS

Electronic Products, May 12, 1983, p. 58.
IBM Tech. Disclosure Bulletin vol. 32 No. 88 Jan 1990 pp. 303-305.

Primary Examiner—Eugene R. LaRoche
Assistant Examiner—F. Niranjan
Attorney, Agent, or Firm—Douglas A. Sorensen; Richard L. Donaldson; William E. Hiller

[57] ABSTRACT

The described embodiments of the disclosed invention provide a semiconductor devices, test apparatus for the semiconductor devices and a method for testing the semiconductor devices. The semiconductor devices may have many different types of pin counts and configurations. Each semiconductor device includes standardized test circuitry. The necessary pins to operate the test circuitry are included in a standardized position on the semiconductor devices relative to the positioning of the semiconductor devices in the test apparatus. Thus a single test apparatus may be utilized to test semiconductor devices having a wide range of pin configurations.

18 Claims, 4 Drawing Sheets

| 36-PIN DEVICE | 70-PIN DEVICE | | | 70-PIN DEVICE | 36-PIN DEVICE |
|---|---|---|---|---|---|
| 1 | 1 | $V_{DD}$ | $V_{DD}$ | 70 | 36 |
|   | 2 | NC | NC | 69 |   |
| 2 | 3 | TBIN | PPOR | 68 | 35 |
|   | 4 | NC | NC | 67 |   |
| 3 | 5 | PSWCK | NC | 66 | 34 |
| ⋮ | ⋮ | ⋮ | ⋮ | ⋮ | ⋮ |
|   | 34 | NC | NC | 37 |   |
| 18 | 35 | $V_{SS}$ | $V_{SS}$ | 36 | 19 |
*Fig. 1*
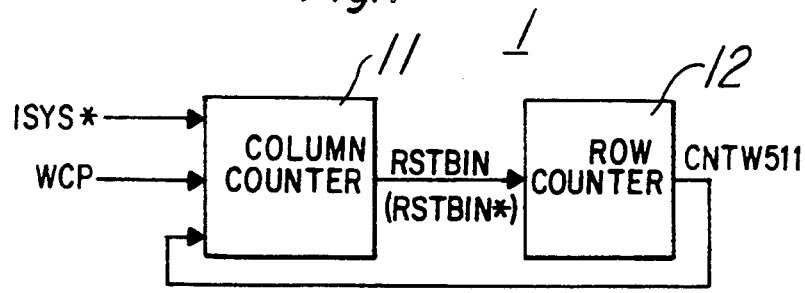
*Fig. 2*
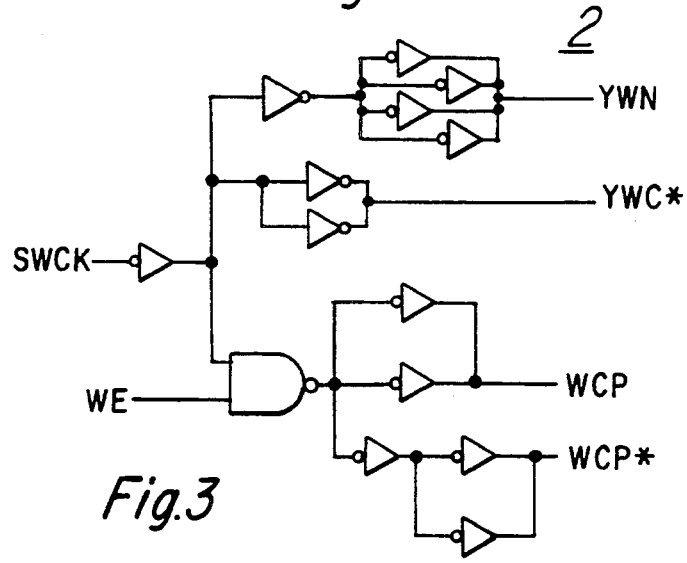
*Fig. 3*

SEMICONDUCTOR MEMORY DEVICE HAVING BURN-IN TEST CIRCUIT

This invention concerns testing of the internal circuit of semiconductor device. More specifically, this invention concerns a test method of semiconductor device which is independent of the pin arrangement of the semiconductor device and can perform the burn-in test effectively.

PRIOR ART

For semiconductor devices, before they are shipped, in order to screen for defective parts, such as inferior gate circuit, capacitor insulating film, etc., the elements are placed in a high temperature of about 125° C., and the power source terminal is connected to a voltage higher than the conventional power source voltage (such as 5 VDC), such as 7-7.5 VDC, for accelerated testing (this test is called 'burn-in test').

In this burn-in test, a plurality of test signals are applied to the various pins of the semiconductor device to be tested via a burn-in test board.

FIG. 13 shows a timing diagram of the burn-in test signals in the field memory.

As shown in this figure, at time point T1, a power source voltage $V_{DD}$, usually 5 VDC, is applied to the field memory. After a prescribed time t1, serial write clock SWCK is applied. After a prescribed time t2, reset write pulse RSTW is applied. The reset write pulse RSTW is applied periodically for every 262, 263 serial write clock SWCK. Each time when reset write pulse RSTW is applied, the 4-bit test data DIN, '0000' and '1111', are applied and are stored in the memory cells of the field memory.

At time point T2, the power source voltage $V_{DD}$ rises to 7.5 VDC, and the burn-in test is started. Before time point T2, serial write clock SWCK and serial read clock SRCK, reset write pulse RSTW and reset read pulse RSTR are applied, and write and read of the aforementioned data DIN are carried out to/from the aforementioned memory cells. From the results of read, it is tested whether the field memory is damaged in the burn-in test or operates normally.

As the power source voltage $V_{DD}$ rises, the voltages applied to the various elements in the device are also increased, and the elements are in the overload state.

PROBLEMS TO BE SOLVED BY THE INVENTION

In this burn-in test, the content of the test signals depends on the type of the semiconductor device to be tested. In addition, the positions of the test signal application pins also depend on the pin arrangement of the semiconductor device to be tested.

Consequently, for each type of semiconductor device, a specific burn-in test board should be manufactured, and the test time is long. These are problems.

In addition, in order to send the aforementioned test signals from outside the semiconductor device into the semiconductor device with the aforementioned timing, a complicated burn-in test board is needed. This is also a problem.

OBJECT OF THE INVENTION

An object of the present invention is to provide a type of semiconductor device characterized by the following facts: power source terminal, clock application terminal and test mode application terminal are arranged at the common terminal position of the semiconductor devices; the aforementioned semiconductor device has a test signal generating circuit which generates test signals for testing of an internal circuit on the basis of the signals applied from the aforementioned terminals; based on the signals applied from the aforementioned terminals, the aforementioned test signal generating circuit generates a test signals, and based on the test signals, an internal circuit of the aforementioned semiconductor device is tested.

In addition, this invention also provides a test method of an internal circuit of a semiconductor device characterized by the following facts: when the internal circuit of the semiconductor device is tested, power source voltage, clock and test mode signal are input, the test signals needed for testing the aforementioned internal circuit are generated by a test signal generating circuit in the semiconductor device on the basis of the input signals, and are used to carry out a test of the internal circuit of the aforementioned semiconductor device.

For a semiconductor device, a test signal generating circuit needed for testing an internal circuit of the semiconductor device is formed in the semiconductor device in advance. For the semiconductor device, the terminals to which the least signals needed for operating the test signal generating circuit, that is, power source voltage, clock and test mode signal, are applied are defined as the common pins with the semiconductor devices. Consequently, even for different types of semiconductor devices, a test signals can be applied to the same pins.

For the semiconductor device with this configuration, by applying the corresponding signals on the aforementioned pins, test signals are generated by the test signal generating circuit formed in the semiconductor device, and the test signals are applied to the internal circuit of the semiconductor device.

The results after application of the test signals can be found by monitoring the output pins of the semiconductor device.

BRIEF DESCRIPTION OF THE DRAWINGS

FIG. 1 is a diagram illustrating the pin arrangements of the 70-pin and 36-pin devices in an embodiment of a semiconductor device and its test equipment of this invention.

FIG. 2 is a diagram of a circuit which generates a reset burn-in test signal in the embodiment of this invention.

FIG. 3 is a diagram of a circuit which generates an internal clock in the embodiment of this invention.

Figure 4:
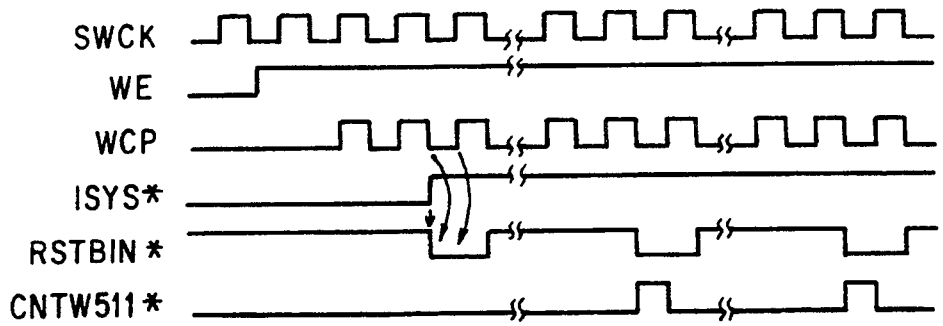
FIG. 4 is a timing diagram of generation of the reset burn-in test signal of FIG. 2.

In reference numerals as shown in the drawings:
1, burn-in test signal generating circuit
2, internal clock generating circuit
3, reset burn-in test signal switching circuit
4, 4A, test data signal generating circuit
5, test data signal switching circuit
6, signal switching circuit
7, internal clock signal switching circuit
8, serial write clock generating circuit.

DESCRIPTION OF THE PREFERRED EMBODIMENTS

FIG. 1 shows the DIP-format pin arrangements of a field memory in an embodiment of a semiconductor device and its test equipment in this invention. In this embodiment, for both the 70-pin and 36-pin devices, the following pins are shown: power source voltage pins VDD, VSS for application of power source voltages $V_{DD}$, $V_{SS}$, pin PSWCK for application of serial write clock SWCK, pin TBIN for application of burn-in test signal BIN, and pin PPOR for application of power on reset signal POR. The pins other than the aforementioned pins are set in the open state (NC).

For the 70-pin and 36-pin devices, the distances between the adjacent pins are different from each other (20 ml pitch and 40 ml pitch, respectively). However, the power source voltage pins VDD, VSS for application of power source voltages $V_{DD}$, $V_{SS}$, pin PSWCK for application of serial write clock SWCK, pin TBIN for application of burn-in test signal BIN, and pin PPOR for application of power on reset signal POR are at the same positions. That is, for both the 36-pin and 70-pin devices, it is possible to apply the test signals at the same pin positions. As a result, it is only needed to manufacture one type of burn-in test board, and this single type of burn-in test board can be used for testing a plurality of semiconductor devices.

FIG. 2 shows a configuration diagram of circuit (1) which generates reset burn-in test signal RSTBIN formed in a field memory. This reset burn-in test signal generating circuit (1) consists of column counter (11) and row counter (12). Column counter (11) is input an initial system signal ISYS* (* represents signal inversion) which are generated from the power reset signal POR and write count pulse WCP. As shown in FIG. 3, this write count pulse WCP is generated by internal clock generating circuit (2). Generally speaking, it is signal formed as the AND signal of the serial write clock SWCK and write enable WE.

FIG. 4 shows a timing diagram for generation of reset burn-in test signal RSTBIN. This reset burn-in test signal RSTBIN is then applied to the circuit to be described later.

Figure 5:
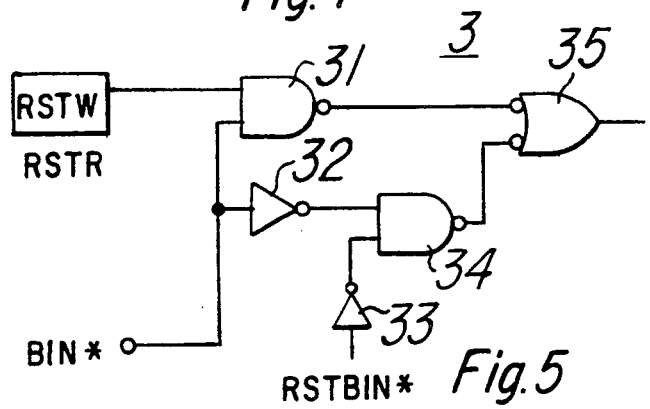
FIG. 5 is a diagram of a switching circuit which switches the reset burn-in test signal and an externally applied reset write pulse in the embodiment of this invention.

FIG. 5 shows a configuration of a signal switch circuit (3) which switches said reset burn-in test signal RSTBIN and the reset write signal RSTW or reset read signal RSTR applied via the bonding pad from the exterior in an ordinary operation of the field memory.

This signal switch circuit (3) is formed within the field memory, and consists of inverters (32), (33), NAND gates (31), (34) and NOR gate (35).

In the burn-in test mode, from outside the field memory, and via said burn-in test signal application pin TBIN, a 'low'-level burn-in test signal BIN* is applied, and the aforementioned reset burn-in test signal RSTBIN* is output from NOR gate (35).

In the ordinary operation mode, the burn-in test signal BIN* is on the 'high'-level; signal switching circuit (3) outputs the reset write signal RSTW or reset read signal RSTR applied from the bonding pad in the ordinary operation.

In this way, in the burn-in test mode, reset burn-in test signal RSTBIN* is applied to the internal control circuit of the field memory. In the ordinary operation mode, reset write signal RSTW or reset read signal RSTR is applied.

Figure 6:
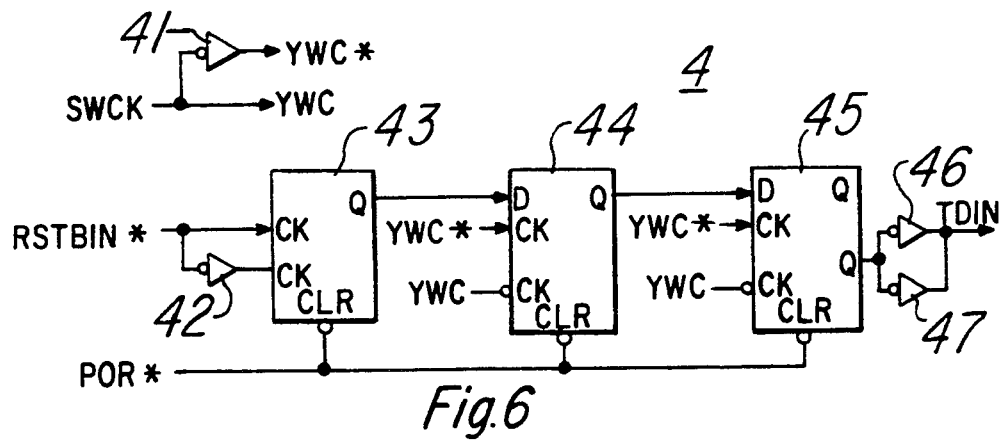
FIG. 6 is a diagram of a circuit which generates a test data in the embodiment of this invention.

FIG. 6 shows a circuit diagram of test data generating circuit (4) formed in the field memory. This test data generating circuit (4) consists of inverters (41), (42), (46), (47), T type flipflop (TFF) (43), and delay flipflops (DFF) (44), (45). Inverters (46), (47) function as driver circuits.

Figure 7:
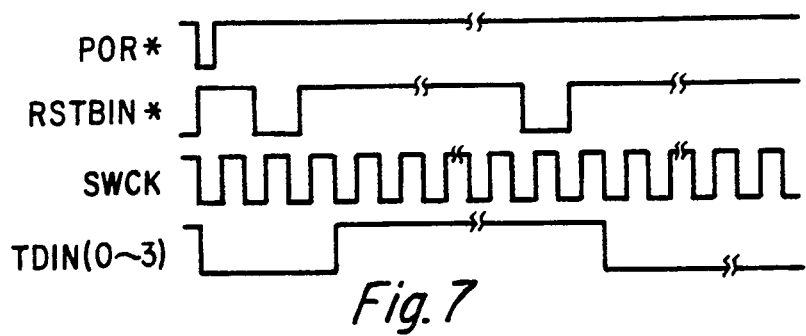
FIG. 7 is a timing diagram of the test data.

FIG. 7 shows a timing diagram of the test data generated by this test data generating circuit (4).

When 'low'-level power-on reset signal POR* is applied from pin PPOR for application of power-on reset signal POR, said FLIP-FLOPS (43)-(45) are reset. Then, when the aforementioned reset burn-in test signal RSTBIN* is applied, corresponding to the serial write clock SWCK applied from pin PSWCK for application of the write clock, the 4-bit internal test data TDIN is output. The test data TDIN are data alternating between '0000' and '1111'.

In the burn-in test mode, the internal data TDIN is stored in the memory cells in the field memory.

Figure 8:
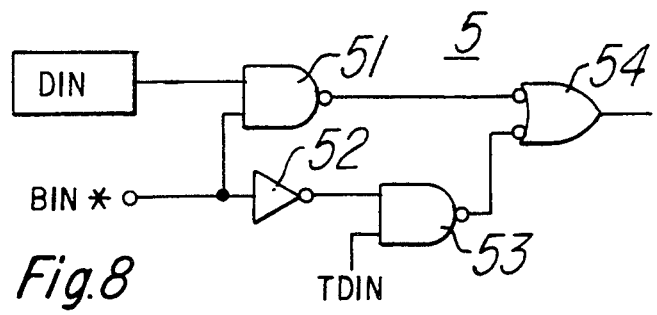
FIG. 8 is a diagram of a circuit which switches the test data and an external data in the embodiment of this invention.

Internally generated test data TDIN are applied to signal switching circuit (5) as shown in FIG. 8. Signal switch circuit (5) consists of NAND gates (51), (53), inverter (52), and NOR gate (54).

Just as in the case of signal switch circuit (3) shown in FIG. 5, for this signal switch circuit (5), in the burn-in test mode, when a 'low'-level burn-in test signal BIN* is applied, the aforementioned internal test data TDIN are output; in the ordinary operation mode, when a 'high'-level burn-in test BIN* is applied, data DIN applied from the outside via the bonding pad are output. These data are applied to the memory cells of the field memory. In the burn-in test, the test data TDIN of '0' and '1' are recorded continuously in the memory cells in an alternating way.

Figure 9:
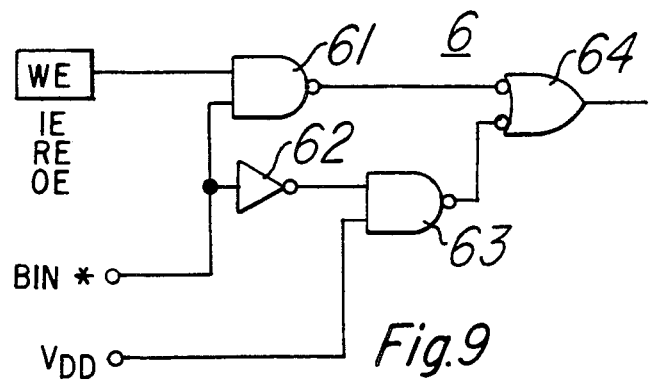
FIG. 9 is a diagram of a switching circuit which switches an internally generated 'high'-level signal and an external write enable in the embodiment of this invention.

FIG. 9 shows signal switching circuit (6) which switches the write enable WE and the internally generated 'high'-level signal. Signal switching circuit (6) consists of NAND gates (61), (63), inverter (62), and NOR gate (64).

In the burn-in test mode, when 'low'-level burn-in test signal BIN* is applied, a 'high'-level signal is always output according to the power source voltage $V_{DD}$ applied to power source pin VDD. In the ordinary operation mode, when a 'high'-level burn-in test signal BIN* is applied, the write enable WE applied from the exterior via the bonding pad is output.

Signal switching circuits of read enable RE, input enable IE, and output enable OE are formed in the field memory. These signal switching circuits are similar to the signal switching circuit (6) which switches the write enable WE as shown in FIG. 9. Just as with the aforementioned signal switching circuit (6), these signal switching circuits also always output a 'high'-level signal in the burn-in test mode.

Figure 10:
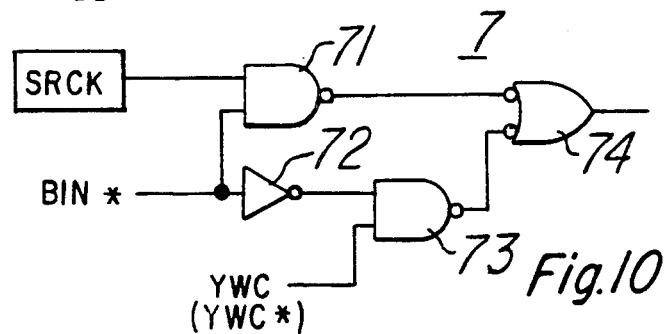
FIG. 10 is a diagram of a circuit which switches the internal clock and an external serial read clock in the embodiment of this invention.

FIG. 10 shows switching circuit (7) which switches the internal clock YWC (YWC*) from clock generating circuit (5) shown in FIG. 3 and the serial read clock SRCK applied from the exterior. This signal switching circuit (7) is also formed in the field memory.

Signal switching circuit (7) consists of NAND gates (71), (73), inverter (72) and NOR gate (74). In the burn-in test mode, when 'low'-level burn-in test signal BIN* is applied, said clock YWC (YWC*) is output; in the ordinary operation mode, when 'high'-level burn-in test signal BIN* is applied, the ordinary serial read clock SRCK applied via the bonding pad is output.

By using the aforementioned circuits, on the base of the test signals from outside the field memory, it is possible to carry out accelerated testing of the internal circuits of the field memory, such as the memory cells and the control circuit.

In the burn-in test mode, the power source voltage $V_{DD}$ is usually higher than the ordinary operation mode's power source voltage (such as 5 VDC), and is applied as 7-7.5 VDC, and the accelerated test is carried out at this high power source voltage. The various elements in the device are applied with proportionally higher voltage as related to the power source voltage in the overload test.

Figure 13:
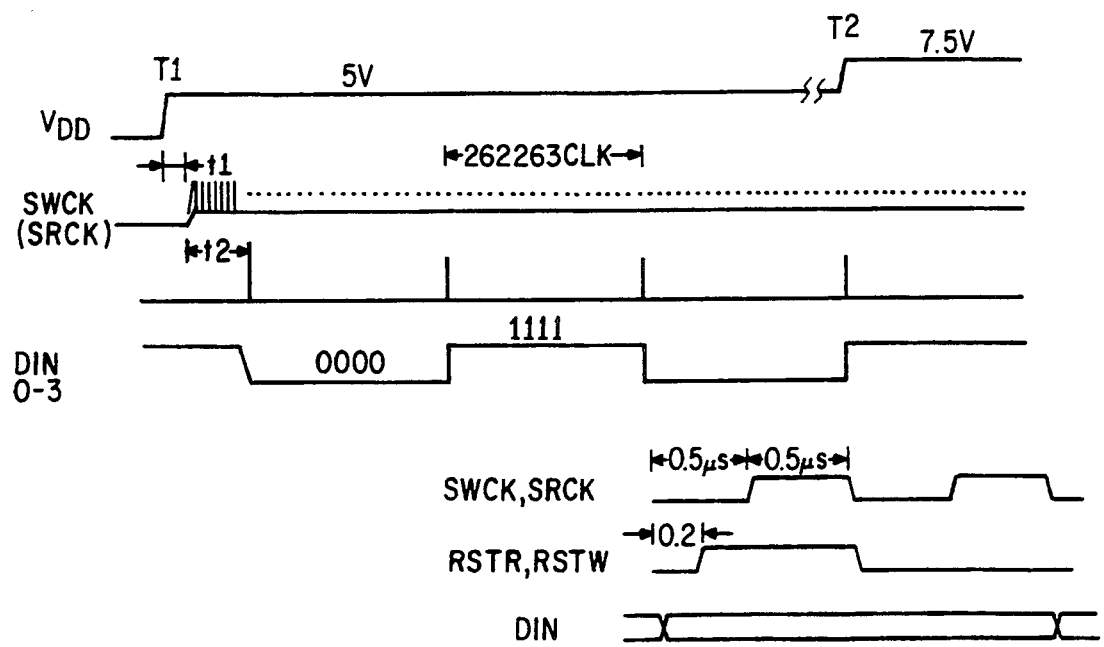
FIG. 13 is a timing diagram of a test signals applied from the exterior in the test of the conventional semiconductor device.

According to this invention, in the test, it is only necessary to apply the aforementioned test signals; hence, the burn-in test board with a complicated circuit configuration for generating the test signals as shown in FIG. 13 is not needed in this case. In addition, since the test signals are small in number, the burn-in test board can be further simplified. Furthermore, since only the ON/OFF test signal is applied in the test, the test operation becomes very simple. Also, as described in the above, for a variety of types of semiconductor devices, the pin position of the semiconductor device is the same for all of them for application of the test signals; this makes employment of the test facility very simple since only one type of test board is needed.

As explained above, the test circuit in the field memory has a very simple configuration. Since this circuit is incorporated in the field memory or other semiconductor circuit, there is no problem related to the degree of integration.

In addition, since the test circuit is incorporated in the semiconductor device, it is also possible to carry out the aforementioned test in a simple way even after shipment.

Figure 11:
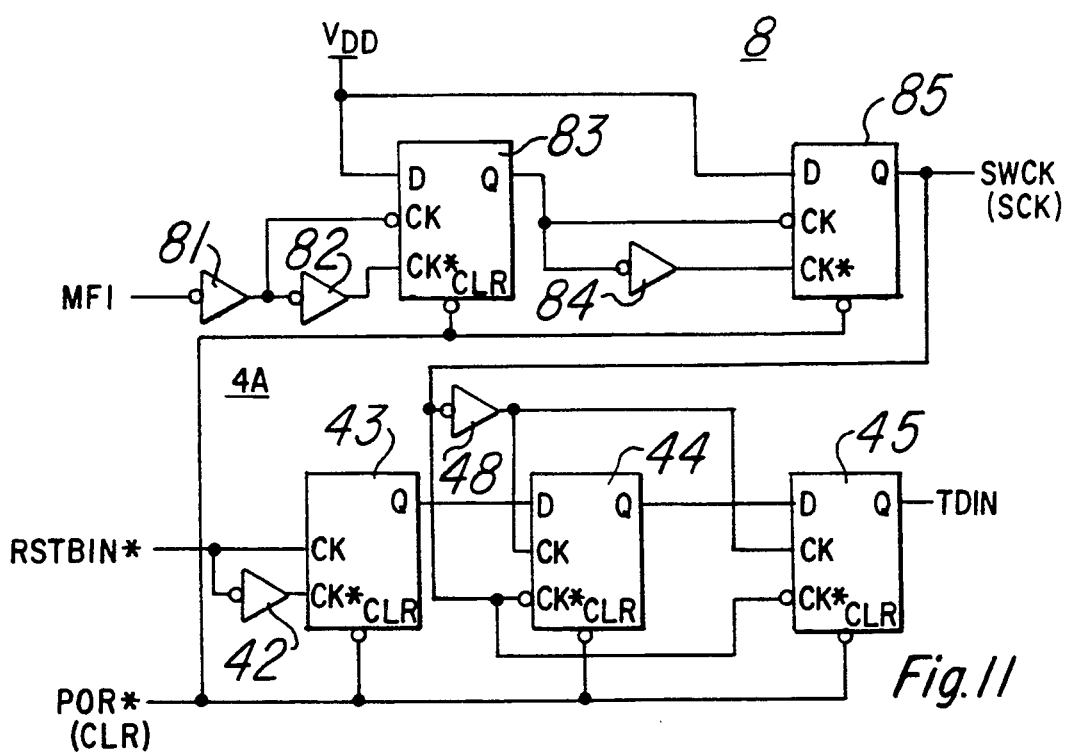
FIG. 11 is a diagram of a circuit which generates a burn-in test signal and a serial write clock in the embodiment of this invention.
Figure 12:
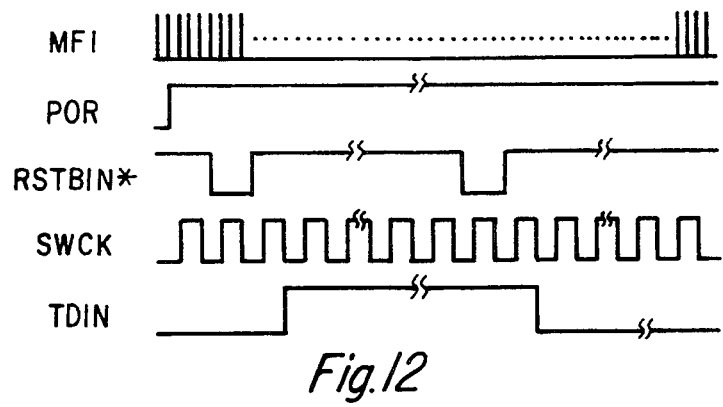
FIG. 12 is a timing diagram of the signal generation in the circuit of FIG. 11.

FIGS. 11 and 12 show a second embodiment of this invention.

FIG. 11 shows the serial write clock SWCK generating circuit (8) and test data TDIN generating circuit (4A). FIG. 12 shows the generation timing of serial write clock SWCK and test data TDIN.

Just like circuit (4) shown in FIG. 6, test data TDIN generating circuit (4A) consists of inverter (42), TFF (43), DFF (44), (45) and inverter (48).

Serial write clock SWCK generating circuit (8) consists of inverters (81), (82), TFF (83), inverter (84) and TFF (85).

On the base of power-on reset signal POR* (or clear signal CLR), said circuits (4A) and (8) are reset, and the operation is started. When power source voltage $V_{DD}$ is applied, the oscillator within the field memory is acted and internal clock signal MF1 with a cycle of 780 ns is generated.

In the burn-in test, when testing is to be carried out at a serial write clock SWCK with a cycle of about 800 ns, that is, at a speed higher than the aforementioned cycle of 780 ns, two stages of TFF (83), (85) are used; when 780-ns internal clock MF1 is input, serial write clock SWCK with cycle of 800 ns is generated.

The generation operation of the test data TDIN is identical to the aforementioned operation. DFF (44), (45) are connected as 2 stages, and timing of test data TDIN and that of serial write clock SWCK are matched to each other in the test.

The operation of switching among the following signals is carried out in the same way as above: serial read clock SRCK, reset write pulse RSTW, reset read pulse RSTR, write enable WE, read enable RE, input enable IE, output enable OE, etc.

In this second embodiment, the power source voltage $V_{DD}$ is also higher than the ordinary power source voltage so as to perform the burn-in test. In addition, the frequency of the serial write clock SWCK is also higher than the ordinary frequency to carry out the burn-in test for the field memory. That is, the accelerated test is carried out with a more severe condition.

As described in the above, when this invention is implemented, it is possible to use various modified forms. For example, in said embodiment, the memory is used as an example of the semiconductor device. However, this invention is not limited to the memory, other types of semiconductor devices may also be used to implement this invention.

In said embodiments, the burn-in tests of the semiconductor device were shown as examples. However, this invention is not limited to burn-in testing, it is applicable for the other types of tests.

In addition, in the above, the semiconductor devices described have the DIP type pin arrangement. However, QFP and other pin arrangement may also be used in this invention.

As described in the above, according to this invention, it is possible to carry out testing of the internal circuits of the semiconductor devices in the same way independent of the specific pin arrangement of the semiconductor devices.

According to this invention, the number of types of signals applied to the semiconductor device under test can be reduced, and it is acceptable only to apply on/off logic signals that indicate the switching states; hence, the application of the test signals can be simplified.

What is claimed is:

1. A system for testing a plurality of types of packaged integrated circuits having a plurality of pin configurations comprising:

a socket capable of receiving said plurality of pin configurations;

a reference voltage terminal provided at a first physical pin location of said socket, each of said integrated circuits having a pin for receiving said reference voltage at said first physical pin location;

a supply voltage terminal provided at a second physical pin location of said socket, each of said integrated circuits having a pin for receiving said supply voltage at said second physical pin location; and at least one control signal terminal provided at a third physical pin location of said socket, each of said integrated circuits including a test circuit for receiving said control signal source and generating control signals appropriate for that integrated circuit, and each integrated circuit having a pin for receiving said control signal at said third physical location.

2. The system of claim 1 wherein said supply voltage provided on said supply voltage terminal is greater than a normal supply level for periods of time determined to coordinate temporally with said control signal.

3. The system of claim 1 wherein said system performs a burn-in test.

4. The system of claim 1 wherein said integrated circuits are memory circuits.

5. The system of claim 1 wherein said integrated circuits are programmable gate arrays.

6. The system of claim 1 further comprising means of elevating the temperature of the integrated circuit being tested.

7. The system of claim 6 wherein said means of elevating the temperature of the integrated circuit is capable of raising the temperature of the integrated circuit to at least 125° C.

8. The system of claim 1 wherein said pin configurations include 70 and 36 pin dual in-line packages.

9. The system of claim 1 wherein said at least one control signal comprises a first, second and third control signals provided at said third, a fourth and a fifth pin position, respectively.

10. A method of testing a plurality of types of packaged integrated circuits having a plurality of pin configurations in a single testing system, comprising the steps of:

providing a socket capable of receiving said plurality of pin configurations;

providing a reference voltage terminal at a first physical pin location of said socket, each of said integrated circuits having a pin for receiving said reference voltage at said first physical pin location;

providing a supply voltage terminal at a second physical pin location of said socket, each of said integrated circuits having a pin for receiving said supply voltage at said second physical pin location; and providing at least one control signal terminal at a third physical pin location of said socket, each of said integrated circuits including a test circuit for receiving said control signal source and generating control signals appropriate for that integrated circuit, and each integrated circuit having a pin for receiving said control signal at said third physical location.

11. The method of claim 10 wherein said supply voltage provided on said supply voltage terminal is provided at a level greater than a normal supply level for periods of time determined to coordinate temporally with said control signal.

12. The method of claim 10 wherein said method is used to perform a burn-in test.

13. The method of claim 10 wherein said integrated circuits are memory circuits.

14. The method of claim 10 wherein said integrated circuits are programmable gate arrays.

15. The method of claim 10 further comprising the step of elevating the temperature of the integrated circuit being tested.

16. The system of claim 15 wherein said step of elevating the temperature of the integrated circuit raises the temperature of the integrated circuit to at least 125° C.

17. The system of claim 10 wherein said pin configurations include 70 and 36 pin dual in-line packages.

18. The system of claim 10 wherein said at least one control signal comprises a first, second and third control signals provided at said third, a fourth and a fifth pin position, respectively.

* * * * *